(12) United States Patent
Okumura et al.

(10) Patent No.: US 8,129,202 B2
(45) Date of Patent: Mar. 6, 2012

(54) PLASMA DOPING METHOD AND APPARATUS

(75) Inventors: Tomohiro Okumura, Osaka (JP); Yuichiro Sasaki, Tokyo (JP); Katsumi Okashita, Osaka (JP); Hiroyuki Ito, Chiba (JP); Bunji Mizuno, Nara (JP); Cheng-Guo Jin, Osaka (JP); Ichiro Nakayama, Osaka (JP)

(73) Assignee: Panasonic Corporation, Osaka (JP)

( * ) Notice: Subject to any disclaimer, the term of this patent is extended or adjusted under 35 U.S.C. 154(b) by 42 days.

(21) Appl. No.: 12/648,142

(22) Filed: Dec. 28, 2009

(65) Prior Publication Data
US 2010/0098837 A1 Apr. 22, 2010

Related U.S. Application Data

(62) Division of application No. 11/884,924, filed on Aug. 23, 2007, now abandoned.

(30) Foreign Application Priority Data

Feb. 23, 2005 (JP) .............................. P. 2005-047598

(51) Int. Cl.
*H01L 21/00* (2006.01)
(52) U.S. Cl. .......................................... 438/10; 438/513
(58) Field of Classification Search .......... 438/7, 10–13, 438/513
See application file for complete search history.

(56) References Cited

U.S. PATENT DOCUMENTS
4,198,246 A 4/1980 Wu
(Continued)

FOREIGN PATENT DOCUMENTS
JP 2718926 12/1988
(Continued)

OTHER PUBLICATIONS

Sasaki, Y., et al., "$B_2H_6$ Plasma Doping with 'In-situ He Preamorphization'", 2004 Symposia on VLSI Technology and Circuits.

*Primary Examiner* — Richard A. Booth
(74) *Attorney, Agent, or Firm* — McDermott Will & Emery LLP

(57) ABSTRACT

It is intended to provide a plasma doping method and apparatus which are superior in the controllability of the concentration of an impurity that is introduced into a surface layer of a sample.

A prescribed gas is introduced into a vacuum container 1 from a gas supply apparatus 2 while being exhausted by a turbo-molecular pump 3 as an exhaust apparatus. The pressure in the vacuum container 1 is kept at a prescribed value by a pressure regulating valve 4. High-frequency electric power of 13.56 MHz is supplied from a high-frequency power source 5 to a coil 8 disposed close to a dielectric window 7 which is opposed to a sample electrode 6, whereby induction-coupled plasma is generated in the vacuum container 1. A high-frequency power source 10 for supplying high-frequency electric power to the sample electrode 6 is provided. Every time a prescribed number of samples have been processed, a dummy sample is subjected to plasma doping and then to heating. The conditions for processing of a sample are controlled so that the measurement value of the surface sheet resistance becomes equal to a prescribed value, whereby the controllability of the impurity concentration can be increased.

21 Claims, 7 Drawing Sheets

U.S. PATENT DOCUMENTS

| | | | |
|---|---|---|---|
| 4,912,065 A | 3/1990 | Mizuno et al. | |
| 6,113,733 A | 9/2000 | Eriguchi et al. | |
| 6,614,050 B1 * | 9/2003 | Yamada et al. | 257/48 |
| 7,192,854 B2 * | 3/2007 | Sasaki et al. | 438/513 |
| 2003/0207476 A1 | 11/2003 | Eriguchi et al. | |
| 2004/0110343 A1 | 6/2004 | Machida et al. | |
| 2005/0287776 A1 | 12/2005 | Sasaki et al. | |

FOREIGN PATENT DOCUMENTS

| | | |
|---|---|---|
| JP | 2-68925 | 3/1990 |
| JP | 11-87448 | 3/1999 |
| JP | 2001-196283 | 7/2001 |
| JP | 2004-179592 | 6/2004 |

* cited by examiner

PLASMA DOPING METHOD AND APPARATUS

CROSS-REFERENCE TO RELATED APPLICATIONS

This application is a Divisional of U.S. application Ser. No. 11/884,924, filed on Aug. 23, 2007 now abandoned, claiming priority of Japanese Patent Application No. 2005-047598, filed on Feb. 23, 2005, the entire contents of each of which are hereby incorporated by reference.

TECHNICAL FIELD

The present invention relates to a plasma doping method and apparatus for introducing an impurity into a surface layer of a solid sample such as a semiconductor substrate.

BACKGROUND ART

Among known techniques for introducing an impurity into a surface layer of a solid sample is a plasma doping method in which an impurity is ionized and introduced into a solid at low energy (refer to Patent document 1, for example). FIG. 11 shows a general configuration of a plasma processing apparatus which is used for a plasma doping method as a conventional impurity introducing method disclosed in the above-mentioned Patent document 1. As shown in FIG. 11, a sample electrode 6 to be mounted with a sample 9 which is a silicon wafer is provided in a vacuum container 1. A gas supply apparatus 2 for supplying a doping material gas including a desired element such as $B_2H_6$ to the inside of the vacuum container 1 and a turbomolecular pump 3 for reducing the pressure in the vacuum container 1 are provided, whereby the pressure in the vacuum container 1 can be kept at a prescribed value. Microwaves are radiated from a microwave waveguide 51 into the vacuum container 1 via a quarts plate 52 as a dielectric window. The microwaves interact with a DC magnetic field formed by an electromagnet 53, whereby microwave plasma with a magnetic field (electron cyclotron resonance plasma) 54 is formed in the vacuum container 1. A high-frequency power source 10 is connected to the sample electrode 6 via a capacitor 55 so as to enable control of the potential of the sample electrode 6. A gas that is supplied form the gas supply apparatus 2 is introduced into the vacuum container 1 through a gas inlet 56 and exhausted into the turbomolecular pump 3 through an exhaust hole 11.

In the above-configured plasma processing apparatus, a doping material gas such as $B_2H_6$ that is introduced through the gas inlet 56 is converted into plasma 54 by a plasma generating means consisting of the microwave waveguide 51 and the electromagnet 53 and boron ions in the plasma 54 are introduced into a surface layer of a sample 9 by means of the high-frequency power source 10.

A method in which a high-frequency current supplied to a sample electrode is measured has been proposed as a method for controlling a doping amount in a plasma doping method and apparatus. FIG. 12 shows a general configuration of an exemplary apparatus of such a type. As shown in FIG. 12, a sample electrode 6 to be mounted with a sample 9 which is a silicon wafer is provided in a vacuum container 1. A gas supply apparatus 2 for supplying a doping gas including a desired element such as $B_2H_6$ to the inside of the vacuum container 1 and a turbomolecular pump 3 for reducing the pressure in the vacuum container 1 are provided, whereby the pressure in the vacuum container 1 can be kept at a prescribed value. High-frequency electric power is supplied to the sample electrode 6 from a power source 10 via a capacitor 55 and a high-frequency current transformer 58, whereby plasma is formed in the vacuum container 1 and boron ions in the plasma are introduced into a surface layer of a sample 9. The doped boron concentration can be controlled by measuring a high-frequency current during a discharge with a current meter 59 via the high-frequency current transformer 58. A counter electrode 57 is opposed to the sample electrode and is grounded (refer to Patent document 2, for example).

MOS transistors, for example, are produced by forming a metal wiring layer on the sample 9 into which the impurity ions have been introduced in the above-describe manner, forming a thin oxide film on the metal wiring layer in a prescribed oxidizing atmosphere, and then forming gate electrodes on the sample 9 with a CVD apparatus or the like. However, in forming transistors, activation processing needs to be performed after the introduction of impurity ions by the plasma doping. The activation processing is processing of re-crystallizing an impurity-introduced layer by heating it by RTA (rapid thermal annealing), spike RTA, laser annealing, flash lamp annealing, or the like. A shallow activation layer can be obtained by heating a very thin impurity-ion-introduced layer effectively. To heat a very thin impurity-ion-introduced layer effectively, processing for increasing, before introduction of impurity ions, the absorbance of light emitted from a light source such as a laser or a lamp of a very thin layer into which to introduce impurity ions is performed. This processing, which is called "pre-amorphization," is as follows. In a plasma processing apparatus which is similar in configuration to the above-described ones, plasma of a He gas, for example, is generated and generated He ions, for example, are caused to be accelerated toward and collide with a substrate by a bias voltage, whereby the crystal structure of a substrate surface layer is destroyed to attain amorphization. This technique has already been proposed by the inventors of this application (refer to Patent document 1, for example).

Patent document 1: U.S. Pat. No. 4,912,065
Patent document 2: Japanese Patent No. 2,718,926
Non-patent document 1: Y. Sasaki et al., "$B_2H_6$ Plasma Doping with In-situ He Pre-amorphization," 2004 Symposia on VLSI Technology and Circuits.

DISCLOSURE OF THE INVENTION

Problems to Be Solved by the Invention

However, the conventional methods have a problem of poor controllability. That is, when the high-frequency electric power is changed to control the high-frequency current, all of the electron density, the boron ion density in plasma, and the energy of ions that reach the substrate 9 are varied.

There is another problem. The high-frequency current that is supplied to the sample electrode includes what is called a displacement current component which does not involve a movement of charge particles such as ions or electrons, and hence may not reflect the amount of ions that impinge on the sample. Therefore, the impurity concentration may not be controlled correctly.

Patent document 2 states that similar results were obtained in ECR (electron cyclotron resonance) discharge. However, where high-density plasma as typified by plasma generated by an ECR discharge is used, if the power of microwaves supplied to the vacuum container is different, doping is performed in a state that the electron density and the boron ion density in plasma are different even if the high-frequency current remains the same. This means a problem that the same doping concentration cannot be obtained.

The present invention has been made in view of the above circumstances, and an object of the invention is to provide a plasma doping method and apparatus which are superior in the controllability of the concentration of an impurity that is introduced into a surface layer of a sample.

Means for Solving the Problems

To attain the above object, a plasma doping method according to the invention comprises the steps of introducing impurity ions into a prescribed number of samples and a dummy sample by plasma doping; establishing a state that a physical quantity corresponding an amount of impurity ions in the dummy sample by applying necessary energy to the dummy sample can be measured; and controlling sample processing conditions so that the physical quantity becomes equal to a predetermined, prescribed value.

This constitution makes it possible to perform plasma doping with high accuracy because an amount of introduced impurity ions can be measured with high accuracy with no influence on plasma doping conditions and the processing conditions are controlled on the basis of the measurement value.

The plasma doping method according to the invention is such that a sample is placed on a sample electrode provided in the vacuum container, a gas is supplied to inside the vacuum container from a gas supply apparatus while the vacuum container is exhausted, plasma is generated in the vacuum container by supplying electric power to the sample electrode while pressure in the vacuum container is controlled to a prescribed value, and impurity ions are introduced into a surface layer of the sample by causing impurity ions in the plasma to be accelerated toward and collide with a surface of the sample. And the plasma doping method according to the invention is characterized by comprising the steps of performing plasma doping on a dummy sample every time a prescribed number of samples have been processed, heating the plasma-doped dummy sample, measuring a sheet resistance of the heated dummy sample, and controlling sample processing conditions so that the measured sheet resistance of the dummy sample becomes equal to a prescribed value.

This constitution makes it possible to realize a plasma doping method that is superior in the controllability of the concentration of an impurity that is introduced into a surface layer of a sample.

The plasma doping method according to the invention is such that a sample is placed on a sample electrode provided in the vacuum container, a gas is supplied to inside the vacuum container from a gas supply apparatus while the vacuum container is exhausted, plasma is generated in the vacuum container by supplying high-frequency electric power to the sample electrode while pressure in the vacuum container is controlled to a prescribed value, and impurity ions are introduced into a surface layer of the sample by causing impurity ions in the plasma to be accelerated toward and collide with a surface of the sample by supplying electric power to the sample electrode. And the plasma doping method according to the invention is characterized by comprising the steps of performing plasma doping on a dummy sample every time a prescribed number of samples have been processed, heating the plasma-doped dummy sample, measuring a sheet resistance of the heated dummy sample, and controlling sample processing conditions so that the measured sheet resistance of the dummy sample becomes equal to a prescribed value.

This constitution makes it possible to realize a plasma doping method that is superior in the controllability of the concentration of an impurity that is introduced into a surface layer of a sample.

In the plasma doping method according to the invention, it is desirable to change the electric power supplied to the sample electrode in controlling the sample processing conditions so that the sheet resistance becomes equal to the prescribed value. Alternatively, the flow rate of a gas including an impurity element, the high-frequency electric power supplied to the plasma source, or the processing time may be changed.

This measure makes it possible to realize a plasma doping method that is superior in the controllability of the concentration of an impurity that is introduced into a surface layer of a sample.

The plasma doping method according to the invention is a plasma doping method that is particularly useful when the sample is a silicon semiconductor wafer. It is also particularly useful when the impurity is arsenic, phosphorus, boron, aluminum, or antimony.

This measure makes it possible to manufacture ultrafine silicon semiconductor devices.

In the plasma doping method according to the invention, preferably, it is desirable to put the entire dummy sample into a high-temperature furnace in heating the dummy sample. Alternatively, the surface of the dummy sample may be irradiated with laser light or lamp radiation light.

This measure makes it possible to increase the controllability of the impurity concentration because activation is performed with high reproducibility.

Preferably, it is desirable to heat the dummy sample in an inert gas atmosphere.

This measure can suppress unfavorable quality changes such as oxidation of the dummy sample. Therefore, activation is performed with high reproducibility and hence the controllability of the impurity concentration can be increased further.

Preferably, it is desirable that the dummy sample be a portion of a sample that is not necessary for devices to be formed in the sample.

This measure makes it possible to minimize the cost of dummy samples when expensive samples such as 300-mm silicon wafers are processed.

The plasma doping method according to the invention is such that a sample is placed on a sample electrode provided in the vacuum container, a gas is supplied to inside the vacuum container from a gas supply apparatus while the vacuum container is exhausted, plasma is generated in the vacuum container by supplying electric power to the sample electrode while pressure in the vacuum container is controlled to a prescribed value, and impurity ions are introduced into a surface layer of the sample by causing impurity ions in the plasma to be accelerated toward and collide with a surface of the sample. And the plasma doping method according to the invention is characterized by comprising the steps of performing plasma doping on a dummy sample every time a prescribed number of samples have been processed, irradiating the plasma-doped dummy sample with a low-energy electron beam, detecting an X-ray radiated from the dummy sample, and controlling sample processing conditions so that a detected dose of the X-ray having a prescribed wavelength or a dose calculated from the detected X-ray dose becomes equal to a prescribed value.

This constitution makes it possible to realize a plasma doping method that is superior in the controllability of the concentration of an impurity that is introduced into a surface layer of a sample.

The plasma doping method according to the invention is such that a sample is placed on a sample electrode provided in the vacuum container, a gas is supplied to inside the vacuum container from a gas supply apparatus while the vacuum container is exhausted, plasma is generated in the vacuum container by supplying high-frequency electric power to the sample electrode while pressure in the vacuum container is controlled to a prescribed value, and impurity ions are introduced into a surface layer of the sample by causing impurity ions in the plasma to be accelerated toward and collide with a surface of the sample by supplying electric power to the sample electrode. And the plasma doping method according to the invention is characterized by comprising the steps of performing plasma doping on a dummy sample every time a prescribed number of samples have been processed, irradiating the plasma-doped dummy sample with a low-energy electron beam, detecting an X-ray radiated from the dummy sample, and controlling sample processing conditions so that a detected dose of the X-ray having a prescribed wavelength or a dose calculated from the detected X-ray dose becomes equal to a prescribed value.

This constitution makes it possible to realize a plasma doping method that is superior in the controllability of the concentration of an impurity that is introduced into a surface layer of a sample.

In the plasma doping method according to the invention, preferably, it is desirable to change the electric power supplied to the sample electrode in controlling the sample processing conditions so that the X-ray dose or the dose becomes equal to the prescribed value. Alternatively, the flow rate of a gas including an impurity element, the high-frequency electric power supplied to the plasma source, or the processing time may be changed.

This measure makes it possible to realize a plasma doping method that is superior in the controllability of the concentration of an impurity that is introduced into a surface layer of a sample.

The plasma doping method according to the invention is a plasma doping method that is particularly useful when the sample is a silicon semiconductor wafer. It is also particularly useful when the impurity is arsenic, phosphorus, boron, aluminum, or antimony.

This measure makes it possible to manufacture ultrafine silicon semiconductor devices.

In the plasma doping method according to the invention, preferably, it is desirable that the energy of the electron beam be in a range of 200 eV to 9 keV.

This measure makes it possible to reduce damage of a sample while securing sufficiently high detection sensitivity.

Preferably, it is desirable that the dummy sample be a portion of a sample that is not necessary for devices to be formed on the sample.

This measure makes it possible to minimize the cost of dummy samples when expensive samples such as 300-mm silicon wafers are processed.

A plasma doping apparatus according to the invention is characterized by comprising a plasma doping chamber provided with a vacuum container, a sample electrode, a gas supply apparatus for supplying a gas to inside the vacuum container, an exhaust apparatus for exhausting the vacuum container, a pressure control device for controlling pressure in the vacuum container, and a sample electrode power source for supplying electric power to the sample electrode; a heating chamber provided with a sample stage and a sample heating device; and a sheet resistance measuring chamber provided with a sample stage and a sheet resistance measuring instrument.

This configuration makes it possible to realize a plasma doping apparatus that is superior in the controllability of the concentration of an impurity that is introduced into a surface layer of a sample.

A plasma doping apparatus according to the invention is characterized by comprising a plasma doping chamber provided with a vacuum container, a sample electrode, a gas supply apparatus for supplying a gas to inside the vacuum container, an exhaust apparatus for exhausting the vacuum container, a pressure control device for controlling pressure in the vacuum container, a plasma source, a plasma source high-frequency power source for supplying high-frequency electric power to the plasma source, and a sample electrode power source for supplying electric power to the sample electrode; a heating chamber provided with a sample stage and a sample heating device; and a sheet resistance measuring chamber provided with a sample stage and a sheet resistance measuring instrument.

This configuration makes it possible to realize a plasma doping apparatus that is superior in the controllability of the concentration of an impurity that is introduced into a surface layer of a sample.

In the plasma doping apparatus according to the invention, preferably, it is desirable that the sample heating device be a high-temperature furnace. Alternatively, the sample heating device may be a laser annealing device which radiates laser light, a laser annealing device which irradiates only a portion of the sample with laser light, a lamp annealing device which radiates lamp radiation light, or a lamp annealing device which irradiates only a portion of the sample with lamp radiation light.

This measure makes it possible to increase the controllability of the impurity concentration because activation is performed with high reproducibility.

Preferably, it is desirable that the heating chamber be provided with a gas supply apparatus for supplying an inert gas to inside the heating chamber.

This measure can suppress unfavorable quality changes such as oxidation of the dummy sample. Therefore, activation is performed with high reproducibility and hence the controllability of the impurity concentration can be increased further.

A plasma doping apparatus according to the invention is characterized by comprising a plasma doping chamber provided with a vacuum container, a sample electrode, a gas supply apparatus for supplying a gas to inside the vacuum container, an exhaust apparatus for exhausting the vacuum container, a pressure control device for controlling pressure in the vacuum container, and a sample electrode power source for supplying electric power to the sample electrode; and an X-ray analyzing chamber provided with a sample stage, an electron beam source, and an X-ray detector.

This configuration makes it possible to realize a plasma doping apparatus that is superior in the controllability of the concentration of an impurity that is introduced into a surface layer of a sample.

A plasma doping apparatus according to the invention is characterized by comprising a plasma doping chamber provided with a vacuum container, a sample electrode, a gas supply apparatus for supplying a gas to inside the vacuum container, an exhaust apparatus for exhausting the vacuum container, a pressure control device for controlling pressure in the vacuum container, a plasma source, a plasma source high-frequency power source for supplying high-frequency electric power to the plasma source, and a sample electrode power source for supplying electric power to the sample electrode; and an X-ray analyzing chamber provided with a sample stage, an electron beam source, and an X-ray detector.

This configuration makes it possible to realize a plasma doping apparatus that is superior in the controllability of the concentration of an impurity that is introduced into a surface layer of a sample.

A plasma doping apparatus according to the invention is characterized by comprising a vacuum container; a sample electrode; a gas supply apparatus for supplying a gas to inside the vacuum container; an exhaust apparatus for exhausting the vacuum container; a pressure control device for controlling pressure in the vacuum container; a sample electrode power source for supplying electric power to the sample electrode; an electron beam source; and an X-ray detector.

This configuration makes it possible to realize a plasma doping apparatus that is superior in the controllability of the concentration of an impurity that is introduced into a surface layer of a sample.

A plasma doping apparatus according to the invention is characterized by comprising a vacuum container; a sample electrode; a gas supply apparatus for supplying a gas to inside the vacuum container; an exhaust apparatus for exhausting the vacuum container; a pressure control device for controlling pressure in the vacuum container; a plasma source, a plasma source high-frequency power source for supplying high-frequency electric power to the plasma source; a sample electrode power source for supplying electric power to the sample electrode; an electron beam source; and an X-ray detector.

This configuration makes it possible to realize a plasma doping apparatus that is superior in the controllability of the concentration of an impurity that is introduced into a surface layer of a sample.

Figure 1:
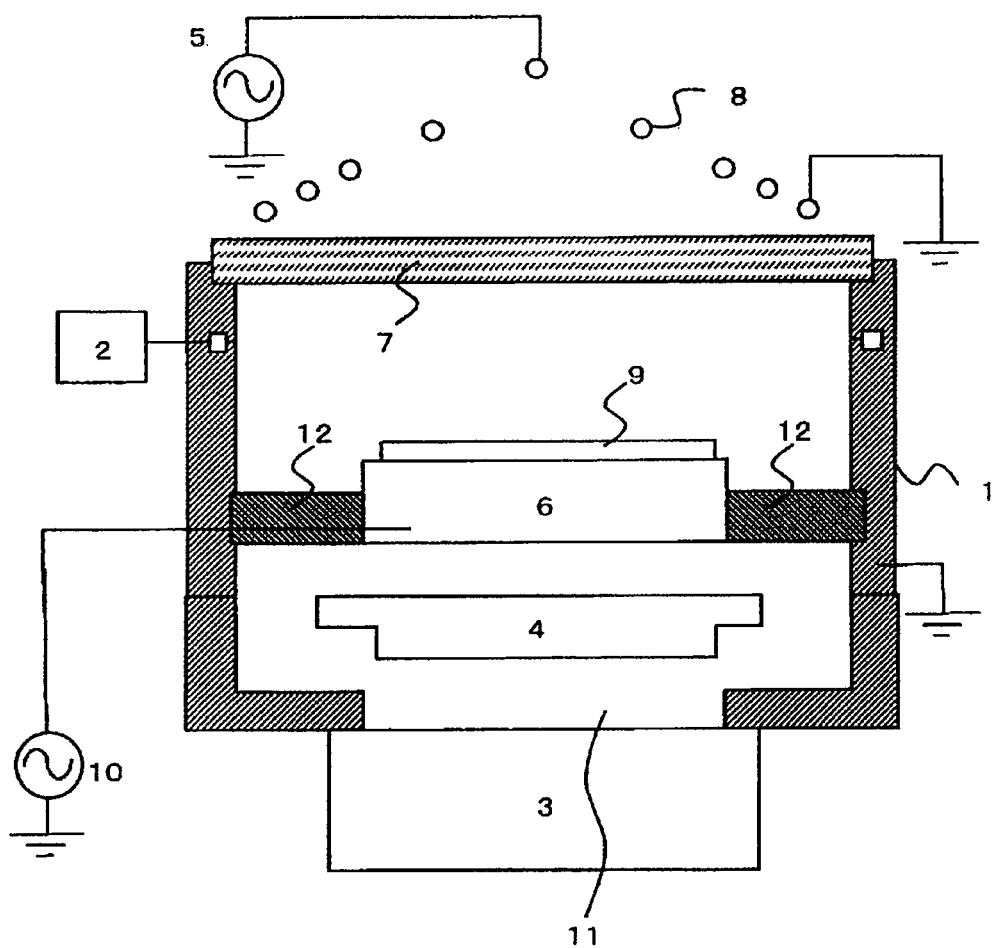
FIG. 1 is a sectional view showing the configuration of a plasma doping chamber used in a first embodiment of the present invention.

1: Vacuum container
2: Gas supply apparatus
3: Turbomolecular pump
4: Pressure regulating valve
5: High-frequency power source
6: Sample electrode
7: Dielectric window
8: Coil
9: Wafer
10: High-frequency power source
11: Exhaust hole

BEST MODE FOR CARRYING OUT THE INVENTION

Embodiments of the present invention will be hereinafter described with reference to the drawings.

Embodiment 1

A first embodiment of the invention will be described below with reference to FIGS. 1-5.

FIG. 1 is a sectional view of a plasma doping chamber of a plasma doping apparatus used in the first embodiment of the invention. As shown in FIG. 1, a prescribed gas is introduced into a vacuum container 1 from a gas supply apparatus 2 while being exhausted by a turbomolecular pump 3 as an exhaust apparatus. The pressure in the vacuum container 1 can be kept at a prescribed value by a pressure regulating valve 4. High-frequency electric power of 13.56 MHz is supplied from a high-frequency power source 5 to a coil 8 disposed close to a dielectric window 7 which is opposed to a sample electrode 6, whereby induction-coupled plasma can be generated in the vacuum container 1. A silicon wafer 9 as a sample is placed on the sample electrode 6. A high-frequency power source 10 for supplying high-frequency electric power to the sample electrode 6 is provided which functions as a voltage source for controlling the potential of the sample electrode 6 so that the potential of the wafer 9 as the sample becomes negative with respect to that of the plasma. With the above arrangement and settings, a surface layer of the sample can be rendered amorphous or an impurity can be introduced into it by causing ions in the plasma to be accelerated toward and collide with the sample surface. The gas that is supplied from the gas supply apparatus 2 is exhausted into the turbomolecular pump 3 through an exhaust hole 11. The turbomolecular pump 3 and the exhaust hole 11 are disposed right under the sample electrode 6, and the pressure regulating valve 4 is an elevation/lowering valve that is located right under the sample electrode 6 and right over the turbomolecular pump 3. The sample electrode 6 is fixed to the vacuum container 1 by four support poles 12.

After a wafer 9 is placed on the sample electrode 6, a helium gas is introduced into the vacuum container 1 from the gas supply apparatus 2 at 50 sccm while the vacuum container 1 is exhausted through the exhaust hole 11 and the temperature of the sample electrode 6 is kept at 25° C. And the pressure in the vacuum container 1 is kept at 1 Pa by controlling the pressure regulating valve 4. Then, high-frequency electric power of 800 W is supplied to the coil 8 as a plasma source, whereby plasma is generated in the vacuum container 1. At the same time, high-frequency electric power of 200 W is supplied to the base of the sample electrode 6. In this manner, a surface crystal layer of a silicon wafer 9 was turned amorphous successfully.

Then, a helium (He) gas and a $B_2H_6$ gas are supplied to the inside of the vacuum container 1 at 100 sccm and 1 sccm, respectively, while the temperature of the sample electrode 6 is kept at 25° C. And high-frequency electric power of 1,000 W is supplied to the coil 8 while the pressure in the vacuum container 1 is kept at 0.5 Pa, whereby plasma is generated in the vacuum container 1. At the same time, high-frequency electric power of 250 W is supplied to the sample electrode 6. In this manner, boron was introduced into a layer close to the surface of a wafer 9 successfully.

Figure 2:
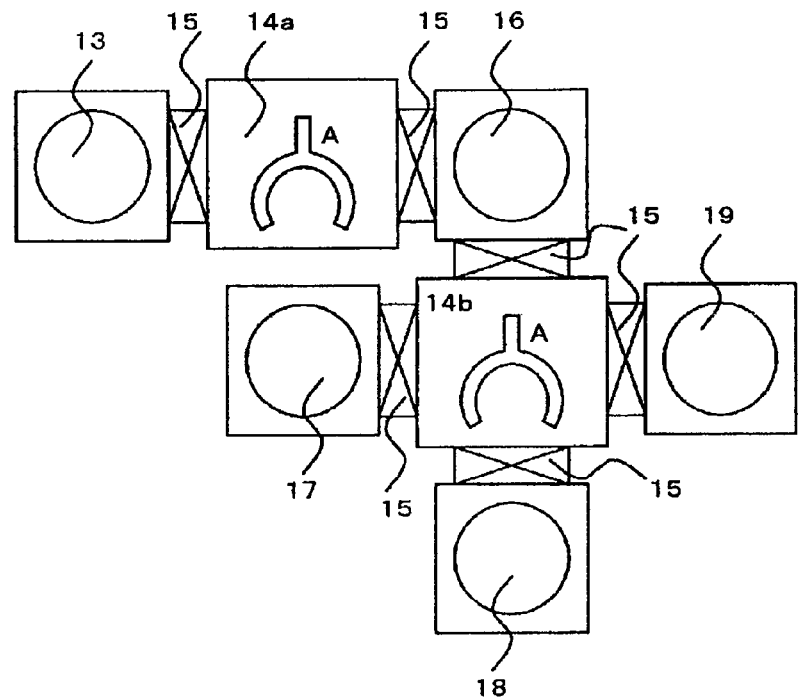
FIG. 2 is a plan view showing the entire configuration of a plasma doping apparatus according to the first embodiment of the invention.

FIG. 2 is a plan view showing the entire configuration of the plasma doping apparatus. Referring to FIG. 2, after a sample is put into a loader chamber 13, the loader chamber 13 is exhausted into a vacuum state. Then, a gate 15 provided between a first transfer chamber 14a and the loader chamber 13 is opened and the sample is moved to the first transfer chamber 14 by manipulating a transport arm A that is provided in the first transfer chamber 14. Then, the sample is moved to a plasma doping chamber 16 by likewise opening and closing a gate 15 properly and manipulating the transport arm A and amorphization and plasma doping are performed in the above-described manner. Then, the sample is moved from the plasma doping chamber 16 to a second transfer chamber 14b. Finally, the sample is moved to an unloader chamber 19 and taken out.

On the other hand, to control the impurity concentration accurately, the impurity concentration is monitored by using a dummy sample. The reasons why the impurity concentration varies even under the same processing conditions are sticking of gases and deposits to the inner surface of the vacuum container, variations in the characteristics of the high-frequency power sources, etc., and cannot be identified easily. In this embodiment, a dummy sample is input every time 25 samples have been processed. Each dummy sample is a single crystal silicon wafer having approximately the same size as samples on which to form devices. Each dummy sample is not subjected to patterning of a resist etc. and amorphization and doping are performed on the entire sample surface. Referring to FIG. 2, first, after a dummy sample is put into the loader chamber 13, the loader chamber 13 is exhausted into a vacuum state. Then, the gate 15 provided between the first transfer chamber 14a and the loader chamber 13 is opened and the dummy sample is moved to the first transfer chamber 14 by manipulating the transport arm A that is provided in the first transfer chamber 14. Then, the dummy sample is moved to the plasma doping chamber 16 by likewise opening and closing the gate 15 properly and manipulating the transport arm A and amorphization and plasma doping are performed under the same conditions as a sample was processed immediately before. Then, the dummy sample is moved from the plasma doping chamber 16 to the second transfer chamber 14b and then to a heating chamber 17.

Figure 3:
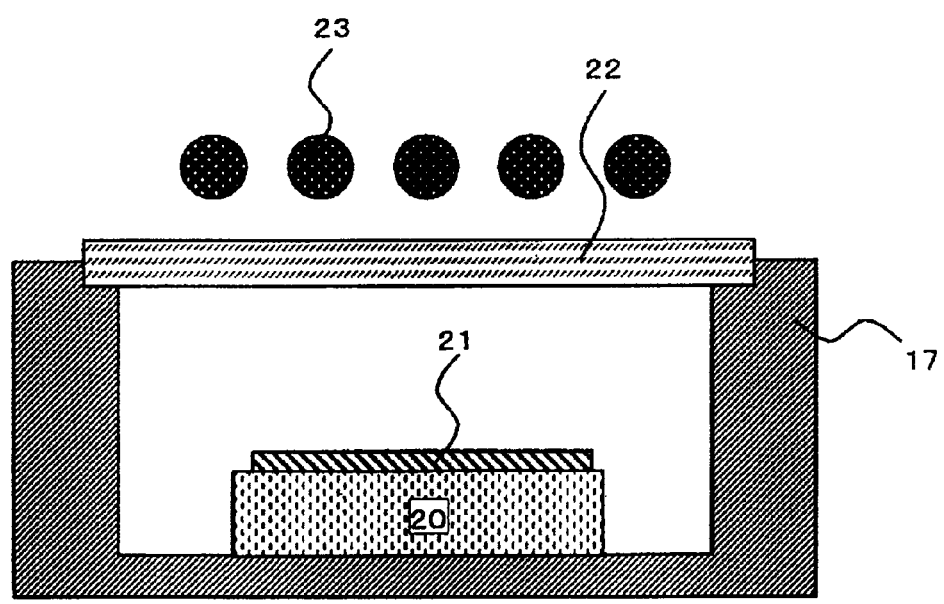
FIG. 3 is a sectional view showing the configuration of a lamp-annealing-type heating chamber used in the first embodiment of the invention.

FIG. 3 is a sectional view showing the configuration of a lamp-annealing-type heating chamber. As shown in FIG. 3, a dummy sample 21 is placed on a sample stage 20 which is provided in the heating chamber 17. Infrared light emitted from a lamp 23 as a sample heating device is applied to the surface of the dummy sample 21 through a window 22. A tungsten halogen lamp can be used as an example of the lamp 23. The lamp irradiation conditions are set so that the temperature of a sample 9 becomes 1,100° C., and activation is performed while those conditions are maintained for 3 minutes.

Figure 4:
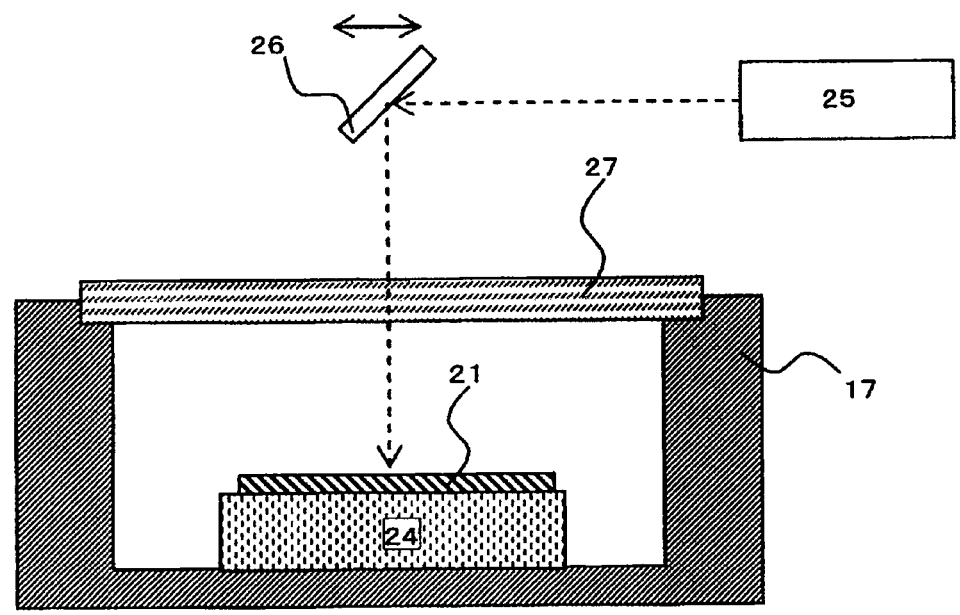
FIG. 4 is a sectional view showing the configuration of a laser-annealing-type heating chamber used in the first embodiment of the invention.

Alternatively, the heating chamber may be of a laser annealing type as shown in FIG. 4. As shown in FIG. 4, a dummy sample 21 is placed on a sample stage 24 which is provided in the heating chamber 17. Laser light emitted from a laser light source 25 as a sample heating device is applied to the surface of the dummy sample 21 through a window 27 after the beam direction is controlled by a mirror 26.

As a further alternative, the heating chamber may be a high-temperature furnace using a ceramic heater or the like. Where a lamp or a laser is used, it is possible to heat only a very thin surface layer of a dummy sample to a high temperature by applying energy to the dummy sample in a pulsive manner. In contrast, where a high-temperature furnace is used, the whole of a dummy sample is heated. High-temperature furnaces have an advantage of being inexpensive.

The dummy sample that has been subjected to the activation by heating is returned to the second transfer chamber 14b and then to a sheet resistance measuring chamber 18 (see FIG. 2).

Figure 5:
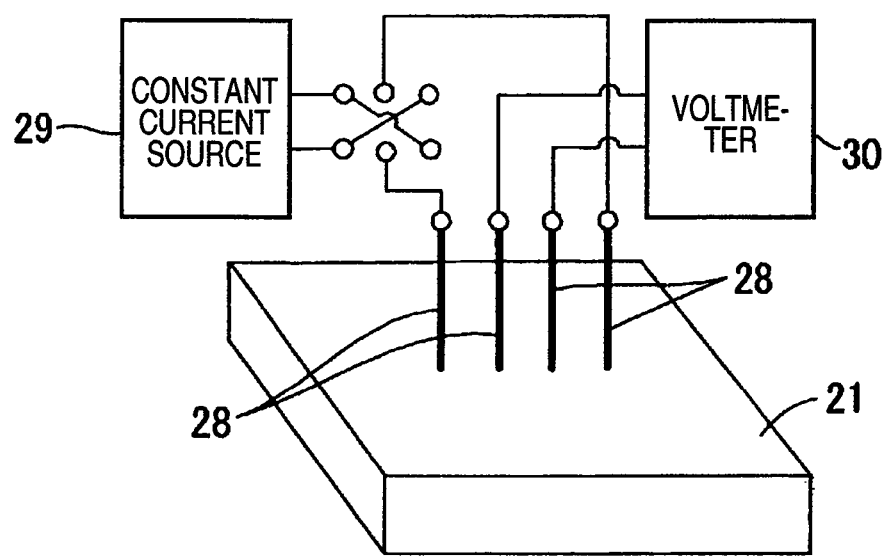
FIG. 5 is a perspective view showing a general configuration of a sheet resistance measuring instrument used in the first embodiment of the invention.

FIG. 5 is a perspective view showing a general configuration of a sheet resistance measuring instrument that is provided in the sheet resistance measuring chamber 18. As shown in FIG. 5, four probes 28 are arranged linearly on the surface of a dummy sample 21 and the two outside probes are connected to a constant current source 28. A voltage that develops between the two inside probes when a current is caused to flow through the dummy sample 21 is measured by a voltmeter 30. More accurately, the average of values of positive and negative currents I caused to flow between the two outside probes that are pressed against the dummy sample 21 and the average of measurement values of corresponding potential differences V between the two inside probes are determined, and a sheet resistance R of the dummy sample is calculated according to the following equation:

$$R=V/I.$$

To obtain a desired impurity concentration, it is necessary that a sheet resistance value that is obtained when activation has been performed by prescribed heating processing have a prescribed value. In view of this, every time 25 samples have been processed, a dummy sample is subjected to plasma doping and the plasma-doped dummy sample is heated. A sheet resistance of the heated dummy sample is measured, and the sample processing conditions are controlled so that the measured sheet resistance value of the dummy sample becomes equal to a prescribed value. More specifically, if the sheet resistance value of the dummy sample is smaller than the prescribed value, the power to be supplied to the sample electrode among the conditions for processing of the next 25 samples is lowered. Alternatively, the flow rate of the gas including the impurity element is lowered, the high-frequency electric power supplied to the plasma source is lowered, or the processing time is shortened.

Conversely, if the sheet resistance value of the dummy sample is larger than the prescribed value, the power to be supplied to the sample electrode among the conditions for processing of the next 25 samples is increased. Alternatively, the flow rate of the gas including the impurity element is increased, the high-frequency electric power supplied to the plasma source is increased, or the processing time is elongated.

How to change the power supplied to the sample electrode, the flow rate of the gas including the impurity element, the high-frequency electric power supplied to the plasma source, or the processing time may be determined in advance by empirically checking to what extents the sheet resistance value varies when each of these control parameters is varied under standard amorphization conditions and doping conditions. Each of these control parameters may be varied by constructing software capable of automatically rewriting a processing recipe that is stored in a control system (not shown) of the apparatus.

With the above configuration, a plasma doping method that is superior in the controllability of the concentration of an impurity that is introduced into a surface layer of a sample was realized.

Embodiment 2

Next, a second embodiment of the invention will be described below with reference to FIGS. 6 and 7.

The first embodiment is directed to the case that a single crystal silicon wafer having approximately the same size as samples on which to form devices is used as a dummy sample. However, this configuration has a disadvantage that the cost of dummy samples is high when expensive samples such as 300-mm silicon wafers are processed. One measure to reduce the cost would be lowering the frequency of inputting dummy samples, for example, processing a dummy sample every time 100 samples, for example, have been processed. However, this produces another disadvantage that the controllability of the impurity concentration is lowered.

The above problem can be solved by a configuration in which that portion of a sample which is not necessary for devices to be formed in the sample is used as a dummy sample. This configuration makes it possible to minimize the cost of dummy samples in processing expensive samples such as 300-mm silicon wafers. Preparing a dummy sample as a portion of every sample makes the controllability of the impurity concentration very high, that is, enables fine adjustments of the processing conditions on a sample-by-sample basis.

Figure 6:
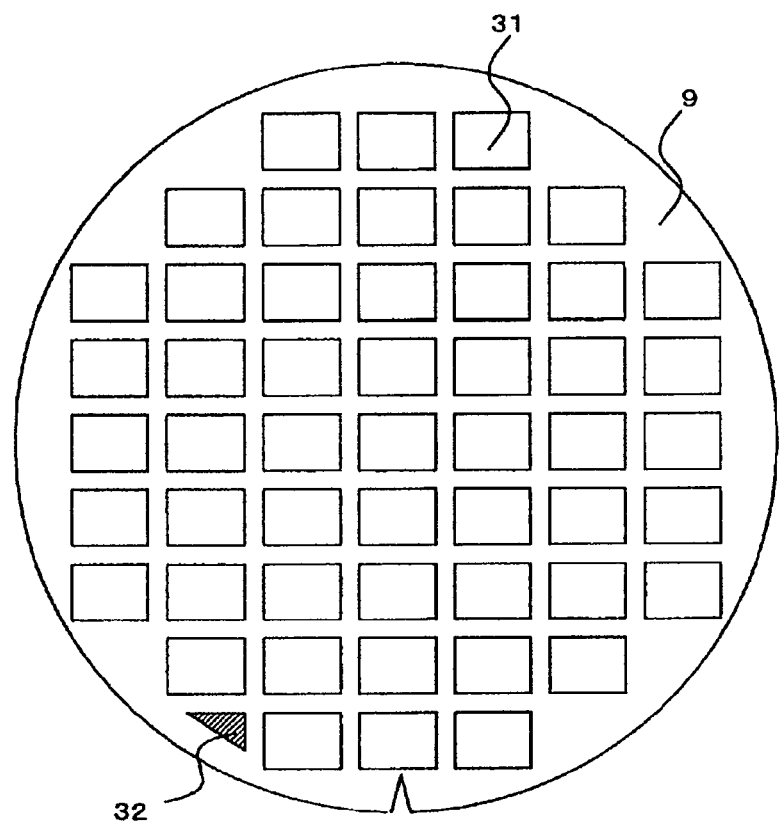
FIG. 6 is a plan view of a silicon wafer used in the second embodiment of the invention.

FIG. 6 is a plan view of a silicon wafer as both of a sample and a dummy sample used in the second embodiment. A large number of chip portions 31 to be divided into semiconductor devices later are provided on a sample 9. Openings for introduction of an impurity are prepared in the chip portions 31 by using a resist or the like. In general, devices are rectangular whereas semiconductor substrates are circular. Therefore, portions that cannot be a chip portion exist in a peripheral area of each wafer. Part of these portions can be used as a dummy sample 32. A resist etc. are not formed in the dummy sample 32, and the whole of the dummy sample 32 is subjected to amorphization and plasma doping.

Figure 7:
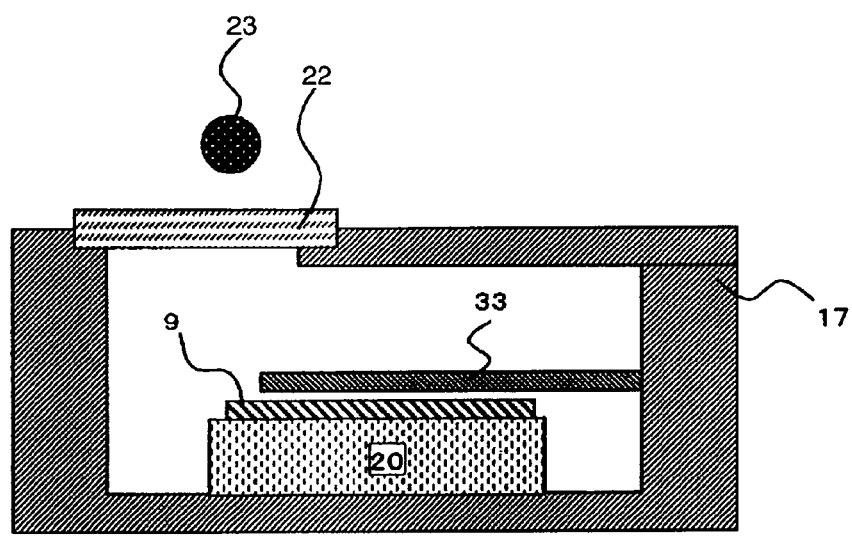
FIG. 7 is a sectional view showing the configuration of a lamp-annealing-type heating chamber used in the second embodiment of the invention.

After amorphization and plasma doping have been performed on such a wafer, partial heating processing is performed in a heating chamber 17 as shown in FIG. 7. As shown in FIG. 7, a sample 9 is placed on a sample stage 20 which is provided in the heating chamber 17. Infrared light emitted from a lamp 23 as a sample heating device is applied to part of the surface of the sample 9 through a window 22. At this time, the sample 9 is covered with a mask 33 so that lamp light shines on only the dummy sample. The use of a flash lamp technique or the like makes it possible to heat only a very thin layer of the dummy sample to 1,000° C. or higher almost without heating the chip portions. Naturally, a laser annealing method may be used as a method for partial heating processing. In this case, satisfactory results are obtained by applying laser light to only a dummy sample by a mirror 26 using a heating chamber that is configured as shown in FIG. 4.

It is desirable to heat a dummy sample in an inert gas atmosphere. This makes it possible to prevent undesirable quality changes such as oxidation of the dummy sample. Therefore, activation can be performed with high reproducibility and the controllability of the impurity concentration can be increased further. To perform such processing, a configuration is desirable in which a gas supply apparatus for supplying an inert gas be provided in the heating chamber. Furthermore, the same advantage can be obtained by heating in a vacuum.

Embodiment 3

A third embodiment of the invention will be described below with reference to FIGS. 8 and 9.

The plasma doping chamber of the plasma doping apparatus is the same as described above with reference to FIG. 1 (first embodiment of the invention), and hence will not be described here.

Figure 8:
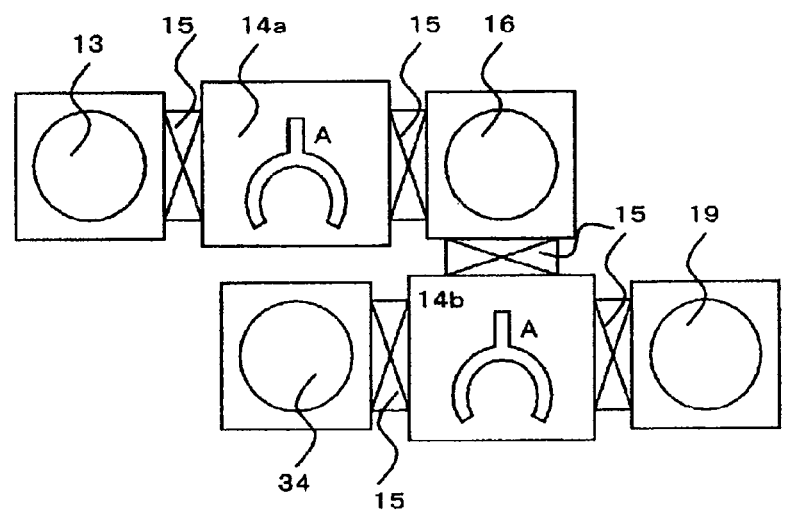
FIG. 8 is a plan view showing the entire configuration of a plasma doping apparatus according to a third embodiment of the invention.

FIG. 8 is a plan view showing the entire configuration of the plasma doping apparatus. Referring to FIG. 8, after a sample is put into a loader chamber 13, the loader chamber 13 is exhausted into a vacuum state. Then, a gate 15 provided between a first transfer chamber 14a and the loader chamber 13 is opened and the sample is moved to the first transfer chamber 14 by manipulating a transport arm A that is provided in the first transfer chamber 14. Then, the sample is moved to a plasma doping chamber 16 by likewise opening and closing a gate 15 properly and manipulating the transport arm A and amorphization and plasma doping are performed there. Then, the sample is moved from the plasma doping chamber 16 to a second transfer chamber 14b. Finally, the sample is moved to an unloader chamber 19 and taken out.

On the other hand, to control the impurity concentration accurately, the impurity concentration is monitored by using a dummy sample. The reasons why the impurity concentration varies even under the same processing conditions are sticking of gases and deposits to the inner surface of the vacuum container, variations in the characteristics of the high-frequency power sources, etc., and cannot be identified easily. In this embodiment, a dummy sample is input every time 25 samples have been processed. Each dummy sample is a single crystal silicon wafer having approximately the same size as samples on which to form devices. Each dummy sample is not subjected to patterning of a resist etc. and amorphization and doping are performed on the entire sample surface.

Referring to FIG. 8, first, after a dummy sample is put into the loader chamber 13, the loader chamber 13 is exhausted into a vacuum state. Then, the gate 15 provided between the first transfer chamber 14a and the loader chamber 13 is opened and the dummy sample is moved to the first transfer chamber 14 by manipulating the transport arm A that is provided in the first transfer chamber 14. Then, the dummy sample is moved to the plasma doping chamber 16 by likewise opening and closing the gate 15 properly and manipulating the transport arm A and amorphization and plasma doping are performed under the same conditions as a sample was processed immediately before.

Then, the dummy sample is moved from the plasma doping chamber 16 to the second transfer chamber 14b and then to an X-ray analyzing chamber 34.

Figure 9:
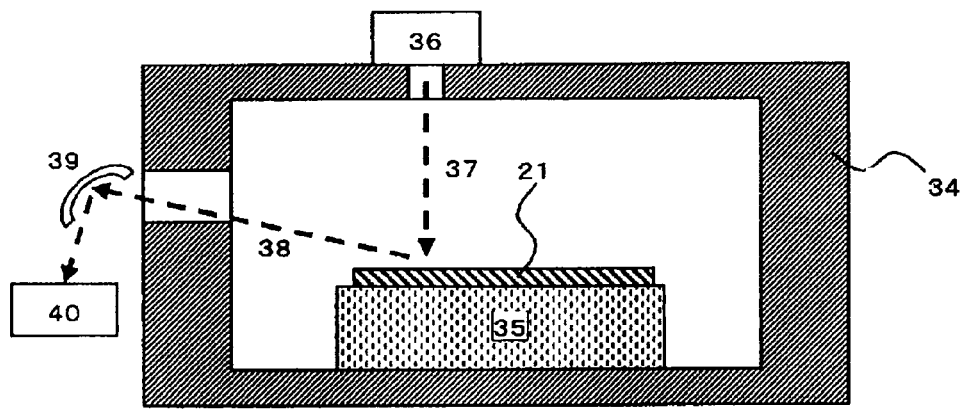
FIG. 9 is a sectional view showing the configuration of an X-ray analyzing chamber used in the third embodiment of the invention.

FIG. 9 is a sectional view showing the configuration of the X-ray analyzing chamber 34. As shown in FIG. 9, a dummy sample 21 is placed on a sample stage 35 that is provided in the X-ray analyzing chamber 34. An electron beam 37 emitted from an electron beam source 36 excites an impurity element with which the dummy sample 21 is doped in a surface layer of 10 to 100 nm in depth. For example, the electron beam causes K-nucleus electrons of the boron element as an impurity to fly out of atoms. As a result, in a relaxation process in which L-nucleus electrons fall to the K nucleus, a characteristic X-ray 38 whose energy corresponds to the difference between the energy levels of the L nucleus and the K nucleus is radiated. In the case of boron, the wavelength of the characteristic X-ray 38 is approximately equal to 65 Å. One can know the concentration (dose) of an impurity such as boron with which the dummy sample is doped in a surface layer by detecting a dose of the characteristic X-ray 38 with a detecting instrument consisting of an analyzer 39 and a detector 40.

The above low-energy-electron-beam-excited X-ray analyzing method makes it possible to detect a wide variety of elements having atomic numbers of 4 to 95. It is preferable to set the electron beam energy in a range of 200 eV to 9 keV. If it is lower than 200 eV, sufficiently high detection sensitivity may not be obtained. On the other hand, if it is higher than 9 keV, trouble may occur such as that a dummy sample is broken or a surface layer of a dummy sample is evaporated and substances constituting the dummy sample stick to the inner surface of the X-ray analyzing chamber.

The dummy sample that has been subjected to the dose measurement is returned to the second transfer chamber 14b (see FIG. 8). Finally, the dummy sample is moved to an unloader chamber 19 and taken out of the apparatus.

To obtain a desired impurity concentration, it is necessary that an X-ray dose or a dose that is calculated from the X-ray dose have a prescribed value. In view of this, every time 25 samples have been processed, a dummy sample is subjected to plasma doping. The plasma-doped dummy sample is irradiated with a low-energy electron beam, and an X-ray that is radiated from the dummy sample is detected. The sample processing conditions are controlled so that the detected dose of an X-ray having a prescribed wavelength or the dose that is calculated from the X-ray dose becomes equal to a prescribed value. More specifically, if the X-ray dose or the dose of the dummy sample is higher than the prescribed value, the power to be supplied to the sample electrode among the conditions for processing of the next 25 samples is lowered. Alternatively, the flow rate of the gas including the impurity element is lowered, the high-frequency electric power supplied to the plasma source is lowered, or the processing time is shortened.

Conversely, if the X-ray dose or the dose of the dummy sample is lower than the prescribed value, the power to be supplied to the sample electrode among the conditions for processing of the next 25 samples is increased. Alternatively, the flow rate of the gas including the impurity element is increased, the high-frequency electric power supplied to the plasma source is increased, or the processing time is elongated.

How to change the power supplied to the sample electrode, the flow rate of the gas including the impurity element, the high-frequency electric power supplied to the plasma source, or the processing time may be determined in advance by empirically checking to what extents the X-ray dose or the dose varies when each of these control parameters is varied under standard amorphization conditions and doping conditions. Each of these control parameters may be varied by constructing software capable of automatically rewriting a processing recipe that is stored in a control system (not shown) of the apparatus.

With the above configuration, a plasma doping method that is superior in the controllability of the concentration of an impurity that is introduced into a surface layer of a sample was realized.

Embodiment 4

A fourth embodiment of the invention will be described below with reference to FIG. 10.

Figure 10:
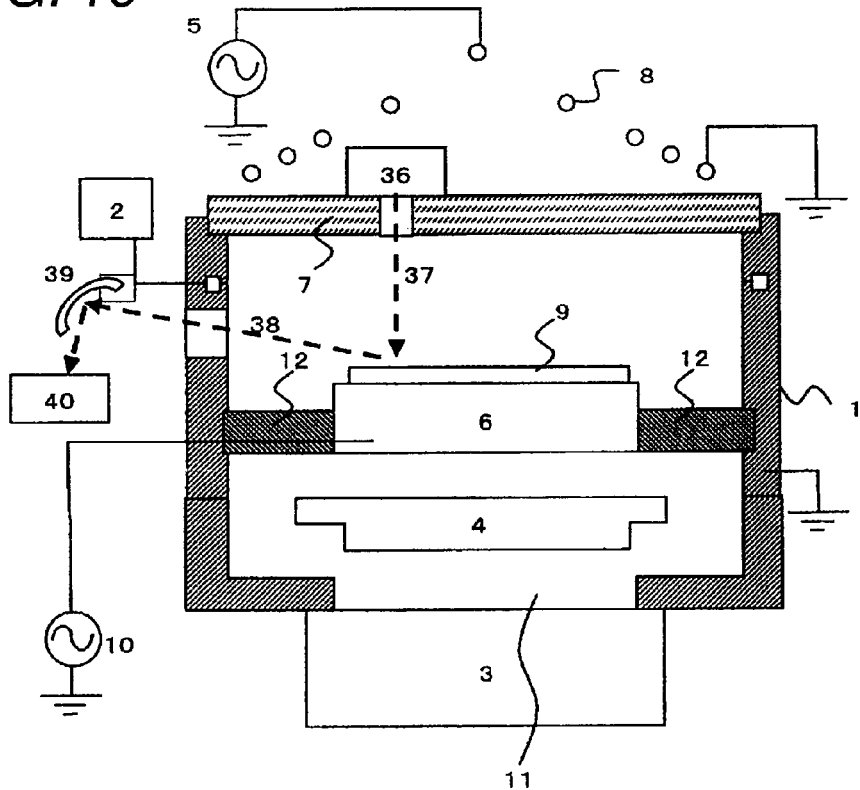
FIG. 10 is a sectional view showing the configuration of a plasma is doping chamber used in a fourth embodiment of the invention.
Figure 11:
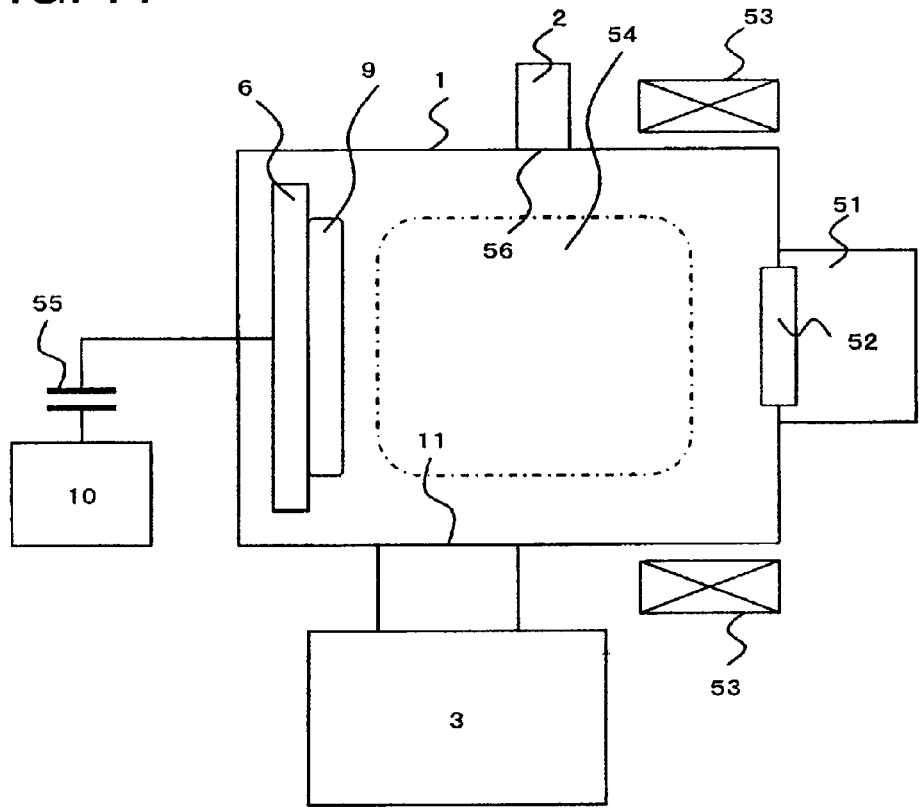
FIG. 11 is a sectional view showing the configuration of a plasma doping apparatus used in a conventional example.
Figure 12:
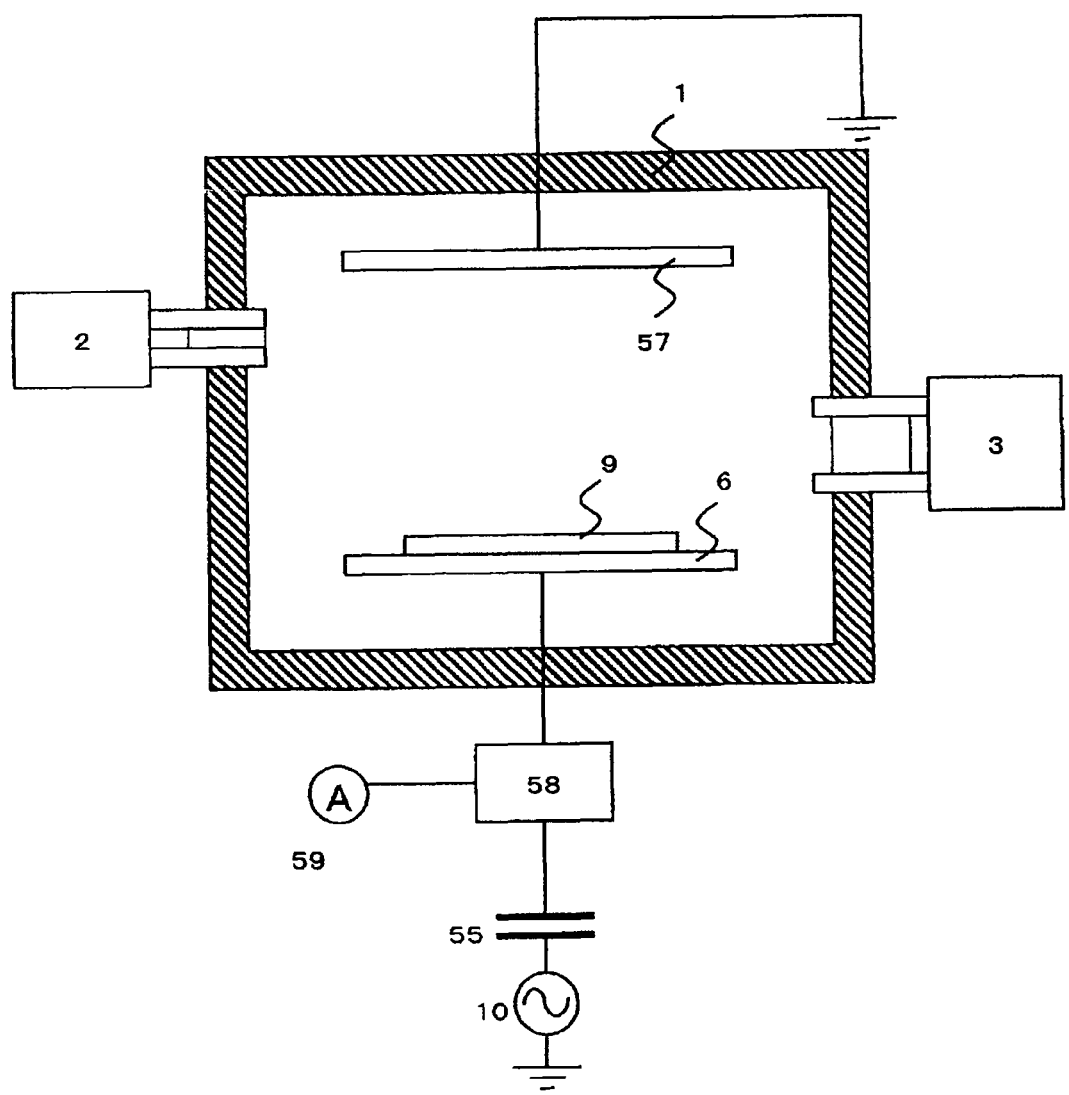
FIG. 12 is a sectional view showing the configuration of a plasma doping apparatus used in another conventional example.

FIG. 10 is a sectional view of a plasma doping chamber of a plasma doping apparatus used in the fourth embodiment of the invention. As shown in FIG. 10, a prescribed gas is introduced into a vacuum container 1 from a gas supply apparatus 2 while being exhausted by a turbomolecular pump 3 as an exhaust apparatus. The pressure in the vacuum container 1 can be kept at a prescribed value by a pressure regulating valve 4. High-frequency electric power of 13.56 MHz is supplied from a high-frequency power source 5 to a coil 8 disposed close to a dielectric window 7 which is opposed to a sample electrode 6, whereby induction-coupled plasma can be generated in the vacuum container 1. A silicon wafer 9 as a sample is placed on the sample electrode 6. A high-frequency power source 10 for supplying high-frequency electric power to the sample electrode 6 is provided which functions as a voltage source for controlling the potential of the sample electrode 6 so that the potential of the wafer 9 as the sample becomes negative with respect to that of the plasma.

With the above arrangement and settings, a surface layer of the sample can be rendered amorphous or an impurity can be introduced into it by causing ions in the plasma to be accelerated toward and collide with the sample surface. The gas that is supplied from the gas supply apparatus 2 is exhausted into the turbomolecular pump 3 through an exhaust hole 11. The turbomolecular pump 3 and the exhaust hole 11 are disposed right under the sample electrode 6, and the pressure regulating valve 4 is an elevation/lowering valve that is located right under the sample electrode 6 and right over the turbomolecular pump 3. The sample electrode 6 is fixed to the vacuum container 1 by four support poles 12.

After a wafer 9 is placed on the sample electrode 6, a helium gas is introduced into the vacuum container 1 from the gas supply apparatus 2 at 50 sccm while the vacuum container 1 is exhausted through the exhaust hole 11 and the temperature of the sample electrode 6 is kept at 25° C. And the pressure in the vacuum container 1 is kept at 1 Pa by controlling the pressure regulating valve 4. Then, high-frequency electric power of 800 W is supplied to the coil 8 as a plasma source, whereby plasma is generated in the vacuum container 1. At the same time, high-frequency electric power of 200 W is supplied to the base of the sample electrode 6. In this manner, a surface crystal layer of a silicon wafer 9 was turned amorphous successfully.

Then, a helium (He) gas and a $B_2H_6$ gas are supplied to the inside of the vacuum container 1 at 100 sccm and 1 sccm, respectively, while the temperature of the sample electrode 6 is kept at 25° C. And high-frequency electric power of 1,000 W is supplied to the coil 8 while the pressure in the vacuum container 1 is kept at 0.5 Pa, whereby plasma is generated in the vacuum container 1. At the same time, high-frequency electric power of 250 W is supplied to the sample electrode 6. In this manner, boron was introduced into a layer close to the surface of a wafer 9 successfully.

A detecting instrument consisting of an analyzer 39 and a detector 40 is provided in the plasma doping chamber as an instrument for measuring an X-ray emitted from a sample to calculate a dose (impurity concentration). Its operation was described in the third embodiment of the invention and hence will not be described here.

A plasma doping method that is superior in the controllability of the thickness of an amorphous layer formed as a surface layer of a sample can be realized by controlling the conditions for the amorphization of a sample so that the X-ray dose measured in the above manner or the dose calculated from the X-ray dose becomes equal to a prescribed value.

In general, openings are formed in a resist or the like in those surface portions of a sample which are to be rendered amorphous or into which an impurity is to be introduced. To facilitate measurement of an X-ray dose or a dose calculated from the X-ray dose, a wide opening portion is formed (the opening portion serves as a dummy sample). If the X-ray dose or the dose is higher than the prescribed value, the power to be supplied to the sample electrode among the conditions for processing of the next, prescribed number of samples is lowered. Alternatively, the flow rate of the gas including the impurity element is lowered, the high-frequency electric power supplied to the plasma source is lowered, or the processing time is shortened.

Conversely, if the X-ray dose or the dose is lower than the prescribed value, the power to be supplied to the sample electrode among the conditions for processing of the next, prescribed number of samples is increased. Alternatively, the flow rate of the gas including the impurity element is increased, the high-frequency electric power supplied to the plasma source is increased, or the processing time is elongated.

How to change the power supplied to the sample electrode, the gas flow rate, the high-frequency electric power supplied to the plasma source, or the processing time may be determined in advance by empirically checking to what extents the X-ray dose or the dose varies when each of these control parameters is varied under standard amorphization conditions and doping conditions. Each of these control parameters may be varied by constructing software capable of automatically rewriting a processing recipe that is stored in a control system (not shown) of the apparatus.

The above-described arrangement and settings make it possible to realize plasma doping processing which is superior in reproducibility. In the above-described configuration, the electron beam source and the X-ray detecting instrument are such that a low-energy electron beam is applied to a sample that is placed on the sample electrode provided in the vacuum container. This dispenses with a special processing chamber for dose measurement and hence makes it possible to increase the productivity.

In the above-described method, the configuration is employed in which that portion of a sample which is not necessary for devices to be formed in the sample is used as a dummy sample. This configuration makes it possible to minimize the cost of dummy samples in processing expensive samples such as 300-mm silicon wafers. Preparing a dummy sample as a portion of every sample makes the controllability of the impurity concentration very high, that is, enables fine adjustments of the processing conditions on a sample-by-sample basis.

It goes without saying that a substrate on which no resist is formed may be used as a dummy sample.

As for the shape of the vacuum container, the type and the manner of disposition of the plasma source, etc. in the application ranges of the invention, only part of various variations have been described in the above-described embodiments of the invention. It goes without saying that various variations other than the above-described ones are possible in applying the invention.

For example, the coil 8 may be a planar one. And a helicon wave plasma source, a magnetically neutral loop plasma source, or a magnetic field microwave plasma source (electron cyclotron resonance plasma source) may be used. A parallel-plane plasma source as shown in FIG. 9 may also be used.

An inert gas other than helium may be used; that is, a gas of one of neon, argon, krypton, and xenon may be used. These inert gases are advantageous in that adverse effects on a sample are less than other gases.

Although the embodiments are directed to the case that the sample is a silicon semiconductor wafer, the invention can also be applied to cases of processing samples made of other various materials. However, the invention relates to the plasma doping method which is particularly useful when the sample is a silicon semiconductor wafer. The invention is particularly useful in the case where the impurity is arsenic, phosphorus, boron, aluminum, or antimony. This configuration makes it possible to manufacture ultrafine silicon semiconductor devices.

The value of what parameter should be changed may be judged by monitoring a vapor-phase state by performing a spectral analysis of plasma light emission, a mass spectrometric analysis, or the like during doping. For example, if the sheet resistance value has varied though no particular variation is found in the vapor-phase state, the power supplied to the sample electrode may be changed rather than the gas flow rate or the high-frequency electric power supplied to the plasma source. Conversely, if a variation is found in the vapor-phase state, the gas flow rate or the high-frequency electric power supplied to the plasma source may be varied rather than the power supplied to the sample electrode.

Although the embodiments are directed to the case that amorphization and doping are performed sequentially in the same plasma processing chamber, they may be performed separately by preparing different plasma processing chambers.

Although the embodiments are directed to the case that the heating chamber and the sheet resistant measuring chamber are provided separately, the sheet resistance measuring instrument may be provided in the heating chamber.

Further, it goes without saying that various variations are possible in the configuration of the entire apparatus.

INDUSTRIAL APPLICABILITY

The amorphizing method and apparatus according to the invention can provide a plasma doping method and apparatus that are superior in the controllability of the concentration of an impurity that is introduced into a surface layer of a sample. Therefore, they can be applied to various uses such as semiconductor impurity doping processes, manufacture of thin-film transistors that are used in liquid crystal devices etc., and surface reforming of various materials.

The invention claimed is:

1. A plasma doping method for generating plasma in a vacuum container and introducing impurity ions into a surface layer of a sample by causing impurity ions in the plasma to collide with a surface of the sample, the method comprising steps of:
introducing impurity ions into a dummy sample by plasma doping;
measuring, directly or indirectly, a dose amount of the impurity ions introduced into the dummy sample; and
determining processing conditions of the plasma doping for processing a subsequent sample which is to be processed after the dummy sample so that a dose amount of the impurity ions to be introduced into the subsequent sample falls within a predetermined range.

2. The plasma doping method according to claim 1, wherein:
the step of measuring comprises steps of heating the dummy sample to which the impurity ions have been introduced, and measuring a sheet resistance of the heated dummy sample, and
the step of determining processing conditions by the plasma doing is peformed based on the measured sheet resistance of the dummy sample.

3. The plasma doping method according to claim 1, wherein:
the step of measuring comprises steps of irradiating the dummy sample to which the impurity ions have been introduced with a low-energy electron beam, and detecting an X-ray radiated from the dummy sample, and the step of determining processing conditions by the plasma doping is performed based on the detected X-ray.

4. The plasma doping method according to claim 1, wherein:
the plasma doping method is such that a sample is placed on a sample electrode provided in the vacuum container, a gas is supplied to an interior of the vacuum container from a gas supply apparatus while the vacuum container is exhausted, plasma is generated in the vacuum container by supplying electric power to the sample electrode while pressure in the vacuum container is controlled to a prescribed value, and impurity ions are introduced into a surface layer of the sample by causing impurity ions in the plasma to be accelerated toward and collide with a surface of the sample.

5. The plasma doping method according to claim 2, wherein the step of determining processing conditions includes determining electric power that is to be supplied to a sample electrode on which the subsequent sample is placed.

6. The plasma doping method according to claim 2, wherein the step of determining processing conditions includes determining a flow rate of a gas including an impurity element to be supplied for processing the subsequent sample.

7. The plasma doping method according to claim 2, wherein the step of determining processing conditions includes determining high-frequency electric power that is to be supplied to a plasma source for processing the subsequent sample.

8. The plasma doping method according to claim 2, wherein the step of determining processing conditions includes determining a processing time for processing the subsequent sample.

9. The plasma doping method according to claim 1, wherein the sample is a silicon semiconductor wafer.

10. The plasma doping method according to claim 1, wherein the impurity ions are ions of one of arsenic, phosphorus, boron, aluminum, and antimony.

11. The plasma doping method according to claim 2, wherein the step of heating comprises putting the entire dummy sample into a high-temperature furnace.

12. The plasma doping method according to claim 2, wherein the step of heating comprises irradiating a surface of the dummy sample with laser light.

13. The plasma doping method according to claim 2, wherein the step of heating comprises irradiating a surface of the dummy sample with lamp radiation light.

14. The plasma doping method according to claim 2, wherein the step of heating is performed in an inert gas atmosphere.

15. The plasma doping method according to claim 1, wherein the dummy sample is a portion of a sample that is not necessary for devices to be formed on the sample.

16. The plasma doping method according to claim 3, wherein energy of the electron beam is in a range of 200 eV to 9 keV.

17. The plasma doping method according to claim 4, wherein the plasma doping is processing in which plasma is generated in the vacuum container by supplying high-frequency electric power to a plasma source.

18. The plasma doping method according to claim 3, wherein the step of determining processing conditions includes determining electric power that is to be supplied to a sample electrode on which the subsequent sample is placed.

19. The plasma doping method according to claim 3, wherein the step of determining processing conditions includes determining a flow rate of a gas including an impurity element to be supplied for processing the subsequent sample.

20. The plasma doping method according to claim 3, wherein the step of determining processing conditions includes determining high-frequency electric power that is to be supplied to a plasma source for processing the subsequent sample.

21. The plasma doping method according to claim 3, wherein the step of determining processing conditions includes determining a processing time for processing the subsequent sample.

* * * * *